(12) United States Patent
Krusell et al.

(10) Patent No.: US 6,274,059 B1
(45) Date of Patent: Aug. 14, 2001

(54) METHOD TO REMOVE METALS IN A SCRUBBER

(75) Inventors: Wilbur C. Krusell, San Jose; Igor J. Malik, Palo Alto, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 08/615,520

(22) Filed: Mar. 11, 1996

Related U.S. Application Data

(63) Continuation of application No. 08/275,632, filed on Jul. 15, 1994, now abandoned.

(51) Int. Cl.[7] .................................................. B44C 1/22
(52) U.S. Cl. .......................... 216/88; 216/89; 216/108; 216/52; 216/53; 156/636.1; 156/645.1; 134/1.3; 134/2; 134/3; 134/6; 134/28; 134/34; 134/41; 438/691; 438/754
(58) Field of Search .................. 216/88, 89, 108, 216/52, 53; 156/636.1, 645.1; 134/2, 3, 1.3, 6, 28, 34, 41; 438/691, 754; 252/79.2, 79.4

(56) References Cited

U.S. PATENT DOCUMENTS

| | | | | |
|---|---|---|---|---|
| Re. 30,283 | * | 5/1980 | Frenier et al. | 252/151 |
| 3,365,401 | * | 1/1968 | Saubestre et al. | 252/149 |
| 3,607,477 | * | 9/1971 | Rao et al. | 156/17 |
| 3,957,529 | * | 5/1976 | Alexander et al. | 134/3 |
| 4,051,057 | * | 9/1977 | Ericson et al. | 134/3 |
| 4,174,290 | * | 11/1979 | Leveskis | 252/142 |
| 4,264,418 | * | 4/1981 | Wood et al. | 134/3 |
| 4,452,643 | * | 6/1984 | Martin et al. | 134/3 |
| 4,529,450 | * | 7/1985 | Panayappan | 134/3 |
| 4,695,327 | | 9/1987 | Grebinski | 134/11 |
| 5,049,200 | * | 9/1991 | Brunner et al. | 134/2 |
| 5,217,569 | * | 6/1993 | Hodgens, II et al. | 156/664 |
| 5,290,361 | * | 3/1994 | Hayashida et al. | 134/2 |
| 5,308,400 | * | 5/1994 | Chen | 134/2 |
| 5,342,449 | * | 8/1994 | Hobein et al. | 134/2 |
| 5,397,397 | * | 3/1995 | Awad | 134/1 |
| 5,466,389 | * | 11/1995 | Ilardi et al. | 252/156 |
| 5,476,606 | * | 12/1995 | Brancaleoni et al. | 252/79.1 |
| 5,498,293 | * | 3/1996 | Ilardi et al. | 134/3 |
| 5,527,423 | * | 6/1996 | Neville et al. | 156/636.2 |
| 5,645,737 | * | 7/1997 | Robinson et al. | 134/3 |
| 5,662,769 | * | 9/1997 | Schonauer et al. | 438/633 |
| 5,696,035 | * | 12/1997 | Kitano | 438/172 |
| 5,723,019 | * | 3/1998 | Krusell et al. | 134/6 |
| 5,744,439 | * | 4/1998 | Bonett | 134/3 |
| 5,837,662 | * | 11/1998 | Chai et al. | 134/3 |
| 5,868,863 | * | 2/1999 | Hymes et al. | 134/6 |
| 5,909,742 | * | 6/1999 | Ouyang et al. | 134/3 |

FOREIGN PATENT DOCUMENTS

| | | | | |
|---|---|---|---|---|
| 730109 | * | 3/1966 | (CA) | 134/3 |
| 03-255629 A | * | 11/1991 | (JP) . | |

OTHER PUBLICATIONS

Kern, W, ed. Handbook of Semiconductor Wafer Cleaning Technology. pp 29–43, 400–405, 1993.*

Lewis, R.J., Sr., Hawley's Condensed Chemical Dictionary, 12th ed., p. 286, 1993.*

* cited by examiner

Primary Examiner—Randy Gulakowski
Assistant Examiner—Anita Alanko
(74) Attorney, Agent, or Firm—Martine Penilla, LLP

(57) ABSTRACT

A method to remove metal contaminants in a substrate cleaning process. The present invention may replace or be used in conjunction with other substrate cleaning systems. This method comprises adding a citric acid solution to the liquid medium of a semiconductor substrate cleaning system. This method is described in the manner it is used in conjunction with a scrubber wherein both sides of a wafer are scrubbed.

19 Claims, 3 Drawing Sheets

DSS System Configuration

Wet Send Indexer Station 110

Outside Brush Station 120

Inside Brush Station 130

Rinse, Spin & Dry Station 140

Output Station 150

METHOD TO REMOVE METALS IN A SCRUBBER

This is a continuing application of application Ser. No. 08/275,632, entitled "Method to Remove Metals in a Scrubber", filed on Jul. 15, 1994, now abandoned.

BACKGROUND OF THE INVENTION

1. Field of the Invention

This invention relates to methods of processing a substrate, and more specifically, to a method for the removal of metal contaminants during the cleaning process of, for example, semiconductor wafers.

2. Prior Art

In the manufacture of semiconductor devices, the surface of semiconductor wafers must be cleaned of wafer contaminants. If not removed, wafer contaminants may affect device performance characteristics and may cause device failure to occur at faster rates than usual.

In general, there are two types of wafer contamination: particulates and films. Particulates are any bits of material present on a wafer surface that have readily definable boundaries, for example, silicon dust, atmospheric dust, plastic particles, and silicate particles. Films are layers of foreign material on wafer surfaces, for example, metallic films, photoresist residues, and solvent residues. It should be noted that films may break loose and become particles, for example, surface metals.

As there are two types of wafer contamination there are also separate cleaning procedures to remove each of them. Film contaminants are generally removed by chemical cleaning processes and particulates are generally removed by ultrasonic scrubbing or a combination of high pressure spraying and mechanical scrubbing.

The most commonly used chemical cleaning process is the RCA method. The RCA method is used for cleaning bare silicon or silicon wafers which only have thermally grown oxides. This process consists of six steps. First, there is a preliminary cleaning of the wafer. The wafer is immersed in a sulfuric acid-oxidant mixture (such as $H_2SO_4$—$H_2O_2$) which removes the photoresist present on the wafer. Often, even if the resist has previously been stripped, the wafer is immersed into the above described sulfuric acid-oxidant mixture to prepare the wafer surface for the next step in the process. When the wafers are removed from the sulfuric-oxidant mixture they are then rinsed in 18–23° C. deionized and filtered water. Such water is also used for all other rinse steps of the RCA method.

The second step of the RCA method is the removal of residual organic contaminants and certain metals. A fresh mixture of water, ammonium hydroxide, and hydrogen peroxide ($H_2O$—$NH_4OH$—$H_2O_2$, 5:1:1 by volume) is prepared and heated to approximately 75–80° C. The wafers are then submersed into the solution for approximately 10–15 minutes, while the temperature is maintained at approximately 80° C. The wafers are then rinsed for approximately 1 minute in deionized water.

If a thermally grown silicon dioxide film does not completely cover the wafer, then the third step of the RCA method comprises stripping of the hydrous oxide film formed in step two. The wafers are submersed into a mixture of hydrofluoric acid and water (HF—$H_2O$, 1:10 by volume). Following immersion in the hydrofluoric acid, the wafers are rinsed, but only for 20–30 seconds. The short rinse minimizes regrowth of the oxide.

The fourth step of the RCA method is desorption of the remaining atomic and ionic contaminants. A fresh mixture of water, hydrochloric acid, and hydrogen peroxide ($H_2O$—HCl—$H_2O_2$, 6:1:1 by volume) is prepared and heated to approximately 75–80° C. The wafers are submerged into the solution for 10–15 minutes and are then rinsed in deionized water.

Steps five and six comprise drying and storing the wafers, respectively. It should be noted that in all the steps previous to drying, the wafers are kept wet in between each of the steps.

The RCA method is widely used but still has some problems. One problem with the RCA method is that vapors of ammonia and hydrochloric acid form a particulate smoke of ammonium chloride ($NH_4Cl$) when intermixed. Thus, the solutions of step two and step four should be kept separate (i.e. under different exhaust hoods) to avoid wafer contamination from colloidal $NH_4Cl$ particles. A second problem with the RCA method is that the cleaning solution of step two must be closely monitored to prevent depletion of $H_2O_2$, as $NH_4OH$ in the absence of $H_2O_2$ will etch silicon. As an example, depletion of $H_2O_2$ may occur if the solution temperature is allowed to rise above 80° C., at which point rapid decomposition of $H_2O_2$ ensues. Another example is, if impurities are allowed to accumulate in the solution they may accelerate the decomposition of $H_2O_2$. Another problem with the RCA method is that almost every step concludes with a deionized water rinse. Thus, the process as a whole consumes a large amount water. Also, a further problem with the RCA method is that additional metal contaminants are actually deposited on the wafer surface due to the ammonium hydroxide.

An improvement to the RCA method is the use of centrifugal spray cleaning rather than immersion cleaning in solutions. The process of centrifugal spray cleaning operates by using a sequence of fine sprays of cleaning solutions and high purity water to wet the wafers, which are enclosed in a chamber purged with $N_2$. There are many advantages to using centrifugal spray cleaning instead of immersion cleaning in solutions, for example: smaller volumes of chemicals and deionized water are consumed (approximately two thirds less) and wafer surfaces are continually exposed to fresh reagent solutions. Another benefit of centrifugal spray cleaning is that since the wafers do not have to be transferred from one solution to another the system may be automated thus allowing the environment of the process to be carefully controlled.

One method for removal of insoluble particulate contamination is Ultrasonic Scrubbing. In ultrasonic scrubbing wafers are immersed in a suitable liquid medium to which sonic energy in the range of 20,000 to 50,000 Hz is applied. Cavitation, the rapid forming and collapsing of microscopic bubbles in the liquid medium under the pressure of sonic agitation, produces shock waves which impinge on wafer surfaces. The shock waves displace and loosen particulate matter. An improvement upon ultrasonic scrubbing is the megasonic bath. The megasonic bath incorporates the same principles as ultrasonic scrubbing, however, the megasonic bath uses higher frequency sonic waves, approximately 850 kHz. Also, the megasonic bath may be operated with the same solutions used in the RCA chemical film removal process. The use of the RCA solutions in the megasonic bath allows chemical cleaning and contaminant desorption while simultaneously removing particulates.

As with all cleaning processes, ultrasonic scrubbing and the megasonic bath have problems associated with them.

One problem, is the need to prevent shock waves from carrying the particles and redepositing them on the wafer surfaces once they become detached and fall into the liquid medium. Currently, to remedy this problem particles are removed through overflow or filtration. Another problem associated with ultrasonic scrubbing and the megasonic bath is mechanical failure of the substrate film as a result of the ultrasonic energy imparted during the cleaning cycle. Frequently, mechanical failure of the substrate film results in film loss in certain regions, or in the extreme, the entire film may be removed. A further problem with ultrasonic scrubbing and the megasonic bath is that more metals may be deposited on the substrate surface than are removed, if the liquid medium contains ammonium hydroxide.

Another method for the removal of insoluble particulate contamination is the combination of High Pressure Spraying and Brush Scrubbing (brush scrubbing). There are two types of brush scrubbing for silicon wafers: scrubbing one side of a wafer and scrubbing both sides of a wafer, both work in substantially the same manner. During scrubbing a brush is rotated across the surface of the wafer. The brush does not actually touch the wafer, but hydroplanes over its surface. The brush (or brushes) impart motion to the solvents of the scrubber and the moving solvent dislodges particulates. High pressure jet spraying is almost always used with brush scrubbing. The high pressure jet sprays deionized water, at a pressure of approximately 13.8–20.7 MPa, across the surface of the wafer and removes the particulates dislodged by the brush as well as any residual particles generated by the brush.

The common problem to all the above mentioned wafer cleaning methods is that none of them remove metals from the wafer surface. The RCA method, due to the use of ammonium hydroxide, tends to add more metals to the wafer surface rather than remove them. Ultrasonic scrubbing, the megasonic bath and brush scrubbing have the same problem as the RCA method if the scrubber solvent includes ammonium hydroxide. Another problem that ultrasonic scrubbing, the megasonic bath and brush scrubbing have in common is that they do not remove metals unless they are in the form of particulates, and even then they have the problem of redepositing the metals back onto the wafer surface.

What is needed is a method to remove metal contaminants from wafer surfaces that may replace or be used in combination with existing wafer cleaning methods for each type of contaminant.

SUMMARY OF THE INVENTION

The present invention describes a method to remove metals from a substrate surface that may replace or be used in conjunction with other substrate cleaning methods and systems.

The present invention describes a method wherein a contaminated substrate is placed in a semiconductor wafer scrubber where the substrate is then scrubbed in a liquid medium. An acid solution is added to the liquid medium of the scrubber in order to remove metal contaminants from the substrate surface.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures and in which:

FIG. 1b is a cross-sectional view of the DSS-200™ System of FIG. 1a.

DETAILED DESCRIPTION

Figure 1A:
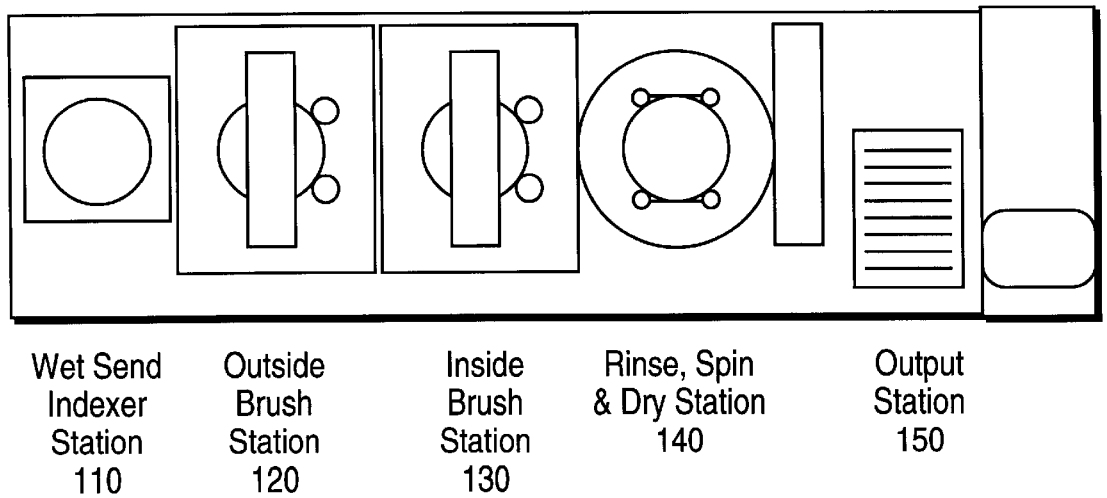
FIG. 1a is a top view of a DSS-200™ System Configuration.

A method to remove metals in a scrubber is disclosed. In the following description, numerous specific details are set forth such as specific process steps, process parameters, materials, solutions, etc., in order to provide a thorough understanding of the present invention. It will be obvious, however, to one skilled in the art that these specific details need not be employed to practice the present invention. In other instances, well known process steps and materials have not been described in detail in order to avoid unnecessarily obscuring the present invention.

The present invention may be employed in a number of substrate cleaning procedures. Although the present invention is described in conjunction with the scrubbing of a wafer or substrate, it will be appreciated that any similarly shaped, i.e. generally flat substrate, may be processed by the methods and apparati of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, or substrates for processing other apparati and devices such as flat panel displays, multichip modules, etc. However, to avoid obscuring the present invention the following description will describe wafer cleaning in general and as an example of a preferred embodiment will describe the use of the present invention in a scrubbing process.

The present invention may replace or be used in combination with existing wafer cleaning processes. In semiconductor cleaning processes basic solutions (solutions with a pH level of approximately 7–14) are used to remove particles and films from wafer surfaces. In general, the existing cleaning processes use only basic solutions that remove particles and films which do not contain metals. The present invention adds an acidic solution to a basic solution, striking a balance, and thus creating a solution which simultaneously removes particles and films that do not contain metals as well as particles and films that do contain metals. In general, the present invention entails the employment of solutions of citric acid, alone or supplemented with other chelating or pH modifying reagents, to remove wafer contamination including metals. Also, the present invention helps to prevent the redepostion of particles containing metals that have been removed or that have been generated by the cleaning system itself.

The present invention incorporates the use of citric acid solutions and other acidic solutions with similar properties into semiconductor wafer cleaning processes. The general concept behind using citric acid in the present invention is that citric acid has chelating and zeta potential properties which make it useful in removing metals from the semiconductor substrate surface and keeping the metals from being redeposited onto the substrate surface once they have been removed. The chelating property of citric acid enables complexing, the formation of citric acid and metal compounds, thus removing metals from the substrate surface. The zeta potential property of citric acid sets up a positive-to-positive zeta potential between the substrate surface and any particles containing a metal such that the substrate surface and particle repel one another. Thus, the particle will not be redeposited onto the substrate surface. It will be obvious to one with skill in the art that other acidic solutions with similar properties as citric acid may be used in place of or in combination with citric acid, for example, oxalic acid and di-ammonium citrate.

During semiconductor processing and during semiconductor wafer cleaning, substrates pick up contaminants. In general, there are two types of contaminants: particles and films. The present invention is particularly useful in the removal of particle and film contaminants which contain metals (metal contaminants), but it will be obvious to one of skill in the art that other contaminants such as silicon, plastic, and silicate particles (general contaminants) will also be removed by the present invention.

There are many processes which remove contaminants from the substrate surface, such as the RCA method, ultrasonic scrubbing, megasonic bath, and brush scrubbing in combination with high pressure spraying (brush scrubbing). Each of these processes may be performed in different embodiments or systems, for example, brush scrubbing may be accomplished using a scrubber wherein only one side of a wafer is scrubbed or a scrubber wherein both sides of a wafer are scrubbed. No matter what embodiment is used for a particular cleaning process, all the processes still have the problem of adding metal contaminants to the substrate.

When the substrates are submersed in cleaning solutions and rinsing solutions the substrates may pick up aluminum (Al) and zinc (Zn) contamination from the plastics used in the cleaning system. Also, if the cleaning system uses a solution that includes ammonium hydroxide ($NH_4OH$), the $NH_4OH$ solution may cause additional metal contaminants, such as, aluminum (Al), zinc (Zn), calcium (Ca), and magnesium (Mg), to be deposited on the substrate. Specific cleaning processes may cause more metal contamination than others. For example, cleaning processes that use scrubbers cause alkali metal contamination of the substrate, as much as an order of magnitude in excess of scrubberless processes. The alkali metal contaminants come from a number of sources, for example, the plastics used in the scrubbing system and from the scrub brushes themselves. The present invention is therefore useful to remove metal contaminants deposited during the processing of semiconductor wafers as well as metal contamination caused by the cleaning processes themselves.

As an example, and not by limitation, the present invention is described in conjunction with a scrubbing process, more specifically, a a scrubbing process wherein both sides of a wafer are scrubbed. FIG. 1a represents the top view of a DSS-200™. The scrubber includes a number of stations. Each of these stations represents one or more steps in the substrate cleaning process. Contaminated substrates are loaded at one end of the system and noncontaminated or less-contaminated substrates are unloaded from the other end of the system. An example of a system of this type is the DSS-200™ available from OnTrak Systems, Inc. of Milpitas, Calif.

Figure 1C:
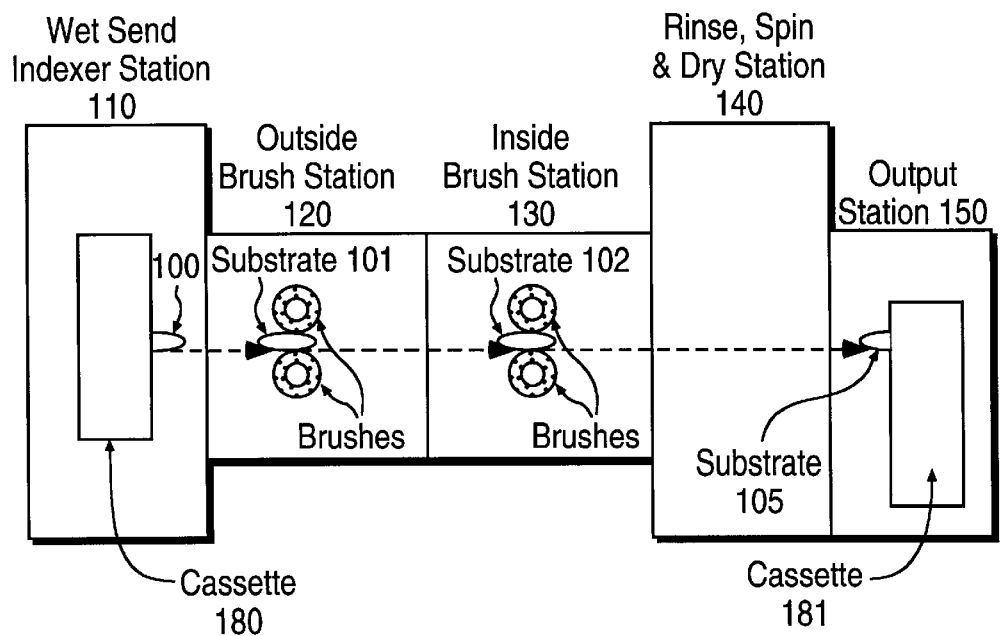
FIG. 1c is a block diagram of the DSS-200™ System of FIG. 1b.
Figure 1B:
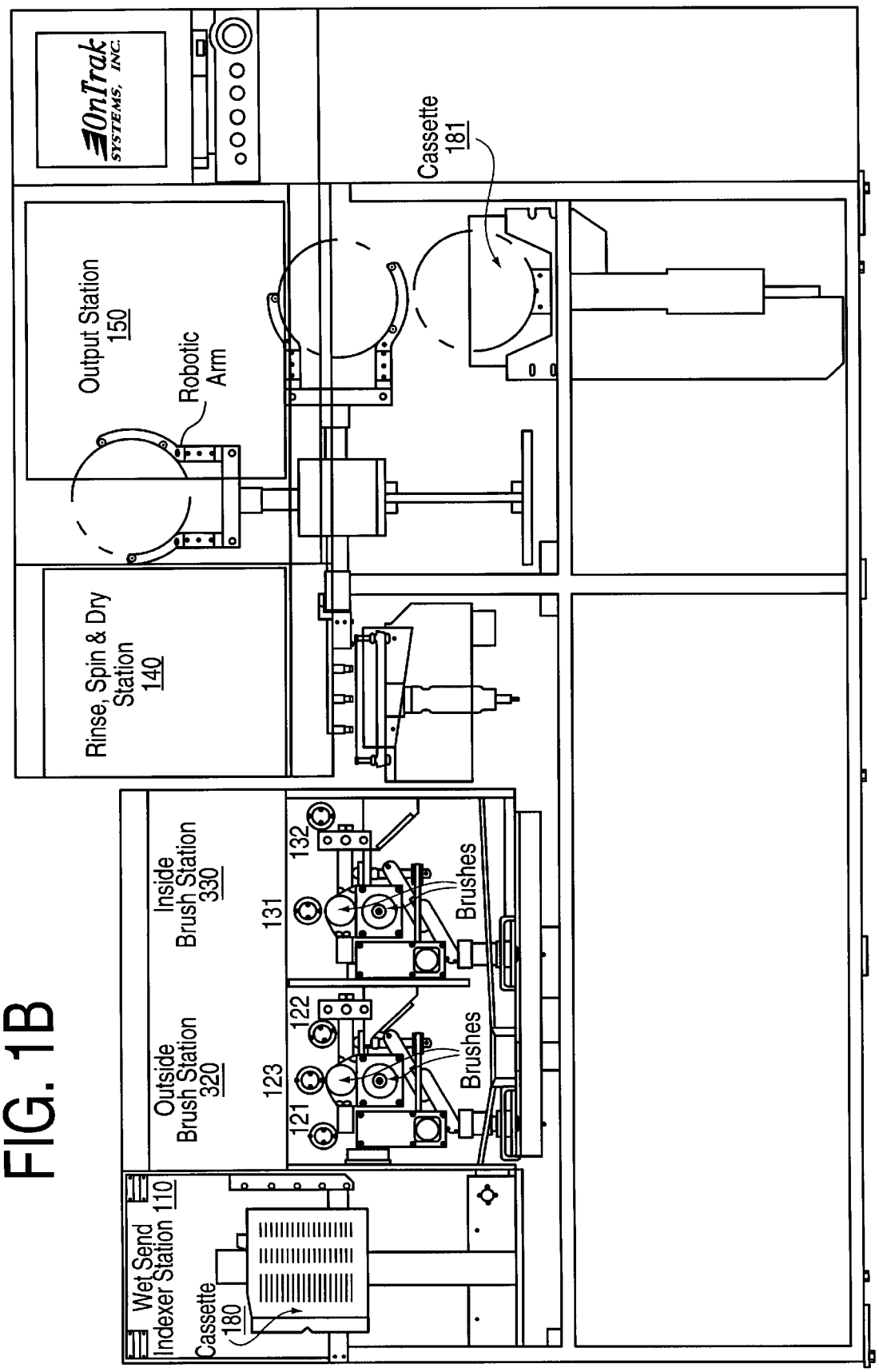
Figure 2:
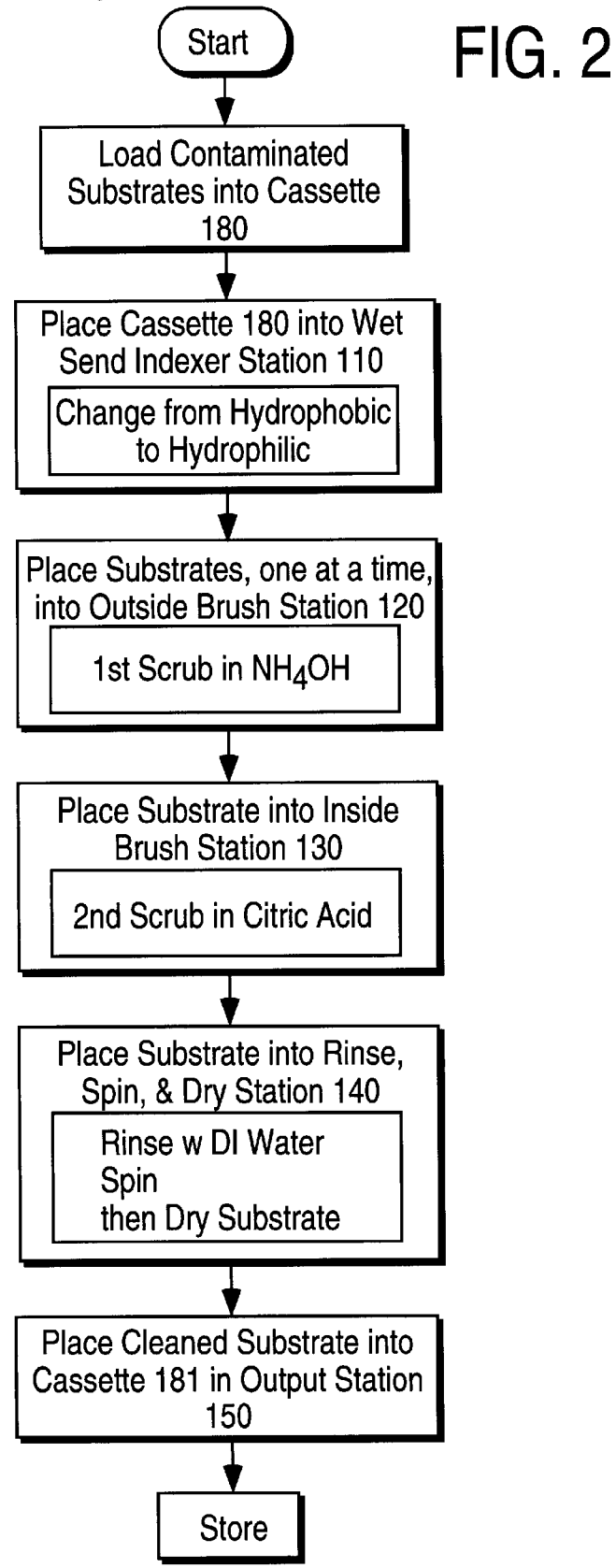
FIG. 2 is a flow chart is a flow chart of the general processing steps executed in each station of the DSS-200™ System in FIGS. 1a, 1b, and 1c.

FIGS. 1b and 1c represent a cross sectional view and a block diagram of a DSS-200™ System Configuration (cleaning system), respectively. FIG. 2 represents a flow chart of the general processing steps executed in each station of the DSS-200™ cleaning system incorporating the present invention. Usually, the contaminated substrates 100 are delivered to the cleaning system after chemical mechanical polishing (CMP) or from a wet bench. At the start of the cleaning process contaminated substrates 100 are loaded into a wafer cassette 180 (cassette) and the cassette 180 is then placed into the wet send indexer station 110.

In the wet send indexer station 110, the surface state of the substrates 100 is changed from hydrophobic to hydrophilic. The present invention is employed in this step so that the surface state of the substrate may be changed without the usual increase in surface metal contamination associated with this process step. To accomplish this the substrates 100 are submersed in a citric acid and hydrogen peroxide solution whose pH level has been adjusted to approximately 6.5–14. It will be obvious to one of skill in the art that citric acid may be replaced by other acids with similar characteristics to those of citric acid, for example, di-ammonium citrate. The pH level of the citric acid and hydrogen peroxide solution is adjusted by adding a basic compound. In a currently preferred embodiment, ammonium hydroxide is used as the basic compound. However, it will be obvious to one of skill in the art that basic compounds such as choline, tetramethyl hydroxide, or any combination thereof may also be used. In a preferred embodiment the surface state of a silicon substrate is changed from hydrophobic to hydrophilic after approximately 15–30 seconds in a solution of water, hydrogen peroxide, ammonium hydroxide ($H_2O$—$H_2O_2$—$NH_4OH$, 20:1:0.09 by volume), and citric acid of approximately 0.57 wt. percent. Another preferred embodiment changes the surface state of a silicon substrate from hydrophobic to hydrophilic after approximately 15–30 seconds in a solution of water, hydrogen peroxide, ammonium hydroxide ($H_2O$—$H_2O_2$—$NH_4OH$, 10:1:0.08 by volume), and citric acid of approximately 1.0 wt. percent. It should be noted that in the above described preferred embodiments the hydrogen peroxide and ammonium hydroxide are approximately 28–30 percent concentrate reagents. Once the surface state of the substrates 100 have been changed to hydrophilic then the substrates 100 are automatically removed from the cassette 180 and placed, one at a time, into the outside brush station 120.

In the outside brush station 120 the substrate 101 is processed through a first scrub. Water jets 121 and 122 keep the substrate wet during the first scrub. The substrate 101 is coated with an ammonium hydroxide ($NH_4OH$) solution by chemical delivery system 123. The chemical delivery system 121 may apply the solution to substrate 101 in different ways. One prior art method is to spray the substrate surface with the chemicals. A new method is to drip the chemicals directly onto the brushes which in turn apply the chemicals to the substrate surface. See copending application entitled, "Drip Chemical Delivery And Apparatus", by Wilbur C. Krusell, et al. filed on even date herewith, which application is assigned to the assignee of the present application.

The concentration of the ammonium hydroxide solution varies with the type of substrate that is being cleaned. Examples of concentrations and their corresponding substrates are: the use of a 0.66 wt. percent $NH_4OH$ for use in the cleaning of hydrophilic pure or epitaxial silicon surfaces and the use of a 2.0 wt. percent $NH_4OH$ solution for use in the cleaning of as-polished ILD oxide films. The $NH_4OH$ solutions are usually made up by weight and monitored by pH level. Generally for the examples given above, the 0.66 wt percent solution has a pH level of approximately 11.2 and the 2.0 wt. percent solution has a pH level of approximately 11.8. It is recognized in the art that in a stable thermal environment these pH levels may be controlled in the range of plus or minus 0.1 units. It should be noted that the ammonium hydroxide solution may include other neutral or alkaline surfactants (ionic or nonionic). Also, for higher pH applications, in the pH range of approximately 12–13, tetramethyl hydroxide (TMAH), sodium hydroxide (NaOH), and potassium hydroxide (KOH) may be added to the ammonium hydroxide solution.

As previously described, the ammonium hydroxide solution and the brush system itself remove general contaminants but add metal contaminants to the substrate surface. Thus, another scrub may be used to remove additional metal contaminants.

The scrubbed substrate 102 is then automatically removed from the outside brush station 120 and placed into the inside brush station 130. During the transfer from one brush station to the next substrate 102 is kept wet by water jets 122. In the inside brush station 130, substrate 102 is processed through a second scrub. The substrate 102 is coated with a citric acid solution by chemical delivery system 131. As in the first scrub step, the chemical delivery system 131 may apply the citric acid solution using the prior art method of spraying it onto the substrate surface or using the above-referenced new method of dripping it onto the brushes which in turn apply it to the substrate surface.

Not only does the concentration and pH level of the acid solution vary with the type of substrate being cleaned, as with the ammonium hydroxide solution, but also the type of acid used varies with the type of substrate that is being cleaned. Several examples (preferred embodiments) of these relationships are described below. However, it should be noted that these are only illustrations and do not limit the scope of the present invention. It will be clear to one of ordinary skill in the art that other variations of the present invention will accomplish similar goals.

One preferred embodiment is the use of an alkaline solution of ammonium citrate to clean specific types of substrates. These substrates include (but are not limited to) pure silicon substrates, silicon epitaxial substrates, thermally grown CVD oxides (doped and undoped), and thermally grown PVD oxides (doped and undoped). The thermally grown oxides may be cleaned both post deposition and post chemical mechanical polishing.

A second preferred embodiment uses a citric acid solution of approximately 0.05–10.0 wt. percent to clean substrate surfaces.

Another preferred embodiment is employed to reduce the level of metal contamination after chemical mechanical polishing (CMP) such as those left behind by aluminum or cerium oxide containing slurries and mixtures of these slurries with standard fumed or colloidal silica slurries. In this preferred embodiment solutions of citric or oxalic acid, and mixed solutions of the two reagents with pH levels of approximately 1.6–2.8 are used. For example, citric acid solutions of approximately 0.1–0.3 wt. percent are used for cleaning pure silicon substrates with low contamination. Another example is using citric acid solutions of approximately 0.5–2.0 wt. percent to clean post CMP polished substrates, especially where an $Al_2O_3$ slurry was used during the CMP process. A further preferred embodiment is when these same acid solutions are mixed with dilute surfactants (especially acid detergents) to yield a cleaning solution capable of removing particulates, metals, and surface organic films.

After the second scrub the substrate 103 is then automatically removed from the inside brush station 130 and placed into the rinse, spin and dry station 140. During the transfer from inside brush station 130 to the rinse, spin, and dry station the substrate 103 is kept wet by water jets 132. Rinse, spin, and dry station 140 rinses, spins, and dries the substrate. Substrate 104 represents a substrate being processed in the rinse, spin, and dry station 140. At this point the wafer has been cleaned. However, it should be noted that the substrate may be further cleaned with the use of another cleaning system such as a megasonic bath, a scrubber wherein only one side of a wafer is scrubbed, or etc. If further cleaning is desired, the metal removal process is facilitated if the substrates are transported and/or stored in citric acid containing solutions.

Once the rinse, spin, and dry steps have been completed the substrate 105 is then transported from the rinse, spin, and dry station 140 to the output station 150 where the substrate 105 will be placed into cassette 181. The transfer is usually carried out by a robotic arm which lifts the substrate out of the rinse, spin, and dry station 140 by its edges and places it into the cassette 181. The cassette is then transferred to storage or to another cleaning or processing system.

It will be clear to one of ordinary skill in the art that some of the steps in the scrubber described above may occur in another order or with different solutions other than as presented. For example, the ammonium hydroxide and citric acid solutions used in the brush stations 120 and 130, respectively, may be reversed. As another example, different solutions, such as water, may be used in place of the ammonium hydroxide solution. For further examples of solutions and process steps see Examples 1–4 below.

It should be noted that while the above description illustrated the use of the present invention in a scrubber wherein both sides of a wafer are scrubbed, the present invention may be used in other cleaning systems and processes. For example, in scrubbers wherein only one side of a wafer is scrubbed the citric acid scrub step may be added between the ammonium hydroxide or water scrubbing step and the final rinse cycle. Another example is in ultrasonic scrub and megasonic bath systems, a citric acid solution may be used in place of or in addition to either the ammonium hydroxide solution or water scrub. A further example is in the RCA method, a citric acid solution may replace the ammonium hydroxide solution or a separate step employing the citric acid solution may be used in conjunction with the RCA method. In addition, it will be appreciated that any of the citric acid or similar acid solutions may be used for the storage and/or transportation of substrates during the fabrication process. For example, the wafers may be stored in a citric or similar acid solution after a process, such as chemical mechanical processing, transported to a cleaning process such as a cleaning process described herein, again in a citric acid solution, if desired, and then stored and/or transported in a citric acid solution prior to the next process. The storage and transport in the citric or similar acid solution helps prevent contamination during storage or transport, which is particularly beneficial in maintaining cleanliness after a cleaning process.

It should also be noted that depending upon the condition of the substrate (e.g. how much and what type of contamination is on the substrate surface) and the particular results desired (e.g. do you want to remove particles, metals, or both) the various cleaning solutions, processes, and systems may be used in a variety of combinations to produce the desired substrate. To illustrate a few of the different types of systems and processes in which the present invention may be used the following examples (Examples 1–4) are given. Examples 1–4 are not all inclusive and are merely used as illustrations of the present invention and do not limit the scope of the present invention. One or more steps in any example may be used in place of or in addition to steps in another example. Other modifications of the examples may be made as well, including the use of different concentrations or combinations of chemicals, etc.

EXAMPLE 1

In a standard scrubber wherein both sides of a wafer are scrubbed a wet send indexer is used to change the surface state of the substrates from hydrophobic to hydrophilic. The substrates are then transferred to the outside brush station where the substrates are scrubbed in an ammonium hydroxide solution ($NH_4OH$) to remove general particle contamination. The substrates are then transferred to the inside brush station where the substrates are scrubbed in a citric acid solution to remove metal contamination. The substrates may then be rinsed, spun, dried, and stored.

EXAMPLE 2

In a standard scrubber wherein both sides of a wafer are scrubbed a wet send indexer is used to change the surface state of the substrates from hydrophobic to hydrophilic. In order to reduce the amount of metal contamination usually associated with this process a citric acid solution is added at the beginning of this process. The substrates are then transferred to the outside brush station where the substrates are scrubbed in $NH_4OH$ to remove general particle contamination. The substrates are then transferred to the inside brush station where the substrates are scrubbed a second time in a citric acid solution to remove additional metal contamination. The substrates may then be rinsed, spun, dried, and stored.

EXAMPLE 3

For epitaxial silicon substrates using citric acid solutions of approximately 0.1–0.3 wt. percent. In a scrubber wherein both sides of a wafer are scrubbed where the wet send indexer has been replaced by a megasonic bath. The surface state of the substrates is changed from hydrophobic to hydrophilic and contamination is removed in the megasonic bath. Depending upon the type of contamination that is desired to be removed various solutions may be used in the megasonic bath, such as a dilute $NH_4OH$—$H_2O_2$—$H_2O$ (RCA solution SC-1) to remove film contamination, $NH_4OH$—$H_2O_2$—$H_2O$ to remove general particle contamination, $NH_4OH$—$H_2O_2$—$H_2O$ with citric acid to remove film and metal contamination, or just citric acid to remove metal contamination. The substrates are then transferred from the megasonic bath to the outside brush station where the substrates may be scrubbed in $NH_4OH$ to remove general particulate contamination, $NH_4OH$ with citric acid (with a pH level of approximately 8–11) to remove general particle and metal contamination, just citric acid to remove metal contamination, or just water. The substrates are then transferred to the inside brush station where the substrates are scrubbed in a citric acid solution to remove metal contamination. The substrates may then be rinsed, spun, dried, and stored.

EXAMPLE 4

For substrates after CMP using citric acid solutions of approximately 0.5–2.0 wt. percent. In a scrubber wherein both sides of a wafer are scrubbed where the wet send indexer has been replaced by a megasonic bath. The surface state of the substrates is changed from hydrophobic to hydrophilic and contamination is removed in the megasonic bath. Depending upon the type of contamination that is desired to be removed various solutions may be used in the megasonic bath, such as $NH_4OH$—$H_2O_2$—$H_2O$ (RCA solution SC-1) to remove film contamination, dilute $NH_4OH$ to remove general particle contamination, $NH_4OH$ with citric acid to remove general particle and metal contamination, or just citric acid to remove metal contamination. The substrates are then transferred from the megasonic bath to the outside brush station where the substrates may be scrubbed in $NH_4OH$ to remove general particulate contamination, or citric acid to remove metal contamination. The substrates are then transferred to the inside brush station where the substrates may be scrubbed in a citric acid solution to remove metal contamination or just water. The substrates may then be rinsed, spun, dried, and stored.

Thus, a method to remove metals in a scrubber has been described. Although specific embodiments, including specific equipment, process steps, process parameters, materials, solutions, and etc. have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method to simultaneously reduce surface metals and particulates in a scrubber comprising:

providing a semiconductor substrate;

placing said substrate in a scrubber;

scrubbing said substrate; and adding an acid solution to said scrubber while scrubbing said substrate, wherein said acid solution comprises an acid selected from the group consisting of: citric acid, oxalic acid, di-ammonium citrate, and any combination thereof.

2. A method for removing surface metal contaminants from substrate surfaces in a scrubber comprising:

providing a semiconductor substrate;

keeping said substrate wet after one of: polishing and epitaxial silicon deposition, and prior to scrubbing;

placing said substrate in a scrubber;

scrubbing said substrate in a scrubber solution; and adding a solution comprising citric acid to said scrubber solution while scrubbing said substrate.

3. The method as described in claim 2 wherein said citric acid solution is approximately 0.05–10.0 wt. percent of citric acid.

4. The method as described in claim 2 wherein said scrubber solution has a pH level in the range of approximately 0–2.8 after said solution comprising citric acid is added.

5. A method for removing surface metal contaminants from hydrophilic substrate surfaces in a scrubber comprising:

providing a semiconductor substrate;

keeping said substrate wet after one of: polishing and epitaxial silicon deposition, and prior to scrubbing;

placing said substrate in a scrubber;

scrubbing said substrate in a scrubber solution; and adding a solution comprising citric acid to said scrubber solution while scrubbing said substrate, wherein said solution comprising citric acid is approximately 0.05–10.0 wt. percent of citric acid, and wherein said scrubber solution has a pH level in the range of approximately 0–2.8 after said solution comprising citric acid is added.

6. A method to remove particles, metals, and surface organic films after chemical mechanical polishing comprising:

providing a semiconductor substrate;

polishing said substrate;

keeping said substrate wet after polishing and prior to scrubbing;

placing said substrate in a scrubber; and scrubbing said substrate in a scrubber solution comprising dilute surfactants and a reagent,
wherein said dilute surfactants comprise acid detergents,
wherein said reagent comprises an acid, wherein said acid is selected from the group consisting of: citric acid, oxalic acid, di-ammonium citrate, and any combination thereof, and
wherein said scrubber solution containing said reagent has a pH level in the range of 1.6–2.8.

7. The method as described in claim 6 wherein said particle is selected from the group consisting of: particulates and particles containing metal.

8. A method to reduce deposition and redeposition of particles in a wafer cleaning process comprising:

providing a semiconductor substrate;

placing said substrate in a solution; and setting up a zeta potential repulsion between a particle and a surface of said substrate,
wherein said zeta potential is a positive-to-positive repulsion,
wherein said cleaning solution sets up said zeta potential,
wherein said cleaning solution has a pH level in the range of approximately 0–2.8, and
wherein said cleaning solution comprises an acid, wherein said acid is selected from the group consisting of: di-ammonium citrate, citric acid, oxalic acid, and any combination thereof.

9. The method as described in claim 8 wherein said particle is selected from the group consisting of: particulates and particles containing metal.

10. A method of processing a substrate comprising:

processing a semiconductor substrate in a first processing operation;

processing said substrate in a second processing operation; and maintaining said substrate in a solution comprising an acid, wherein said acid is selected from the group consisting of: citric acid, di-ammonium citrate, oxalic acid, and any combination thereof.

11. The method as described in claim 10 wherein said first processing operation comprises a scrubbing operation and said second processing operation comprises a drying operation.

12. The method as described in claim 10 wherein said step of maintaining said substrate in a solution comprising an acid is done in said first or said second processing step.

13. The method as described in claim 10 wherein said first processing operation and said second processing operation comprise a scrubbing operation.

14. A method for removing surface metal contaminants from substrate surfaces in a scrubber comprising:

providing a semiconductor substrate;

placing said substrate in a scrubber;

scrubbing said substrate in a scrubber solution; and adding a solution comprising citric acid to said scrubber while scrubbing said substrate.

15. The method as described in claim 14 further comprising the step of:

keeping said substrate wet after one of polishing and epitaxial silicon deposition, and prior to scrubbing.

16. The method as described in claim 14 wherein said citric acid solution is approximately 0.05–10.0 wt. percent of citric acid and wherein said scrubber solution has a pH level in the range of approximately 0–2.8 after said solution comprising citric acid is added.

17. A method to remove particles, metals, and surface organic films after chemical mechanical polishing comprising:

providing a semiconductor substrate;

polishing said substrate;

placing said substrate in a scrubber; and scrubbing said substrate in a scrubber solution comprising dilute surfactants and a reagent;
wherein said reagent comprises an acid selected from the group consisting of: citric acid, oxalic acid, di-ammonium citrate, and any combination thereof.

18. The method as described in claim 17 further comprising the step of:

keeping said substrate wet after polishing and prior to scrubbing.

19. The method as described in claim 17 wherein said scrubber solution containing said reagent has a pH level in the range of 1.6–2.8.

* * * * *